United States Patent [19]
Dondale

[11] Patent Number: 6,040,740
[45] Date of Patent: Mar. 21, 2000

[54] AUDIO TRANSIENT SUPPRESSION DEVICE

[75] Inventor: Charles Stephen Dondale, Fort Collins, Colo.

[73] Assignee: LSI Logic Corporation, Milpitas, Calif.

[21] Appl. No.: 08/833,816

[22] Filed: Apr. 9, 1997

[51] Int. Cl.[7] ..................................... H03F 1/26
[52] U.S. Cl. .......................... 330/149; 330/296; 381/94.5
[58] Field of Search .................. 381/720, 94.5, 381/94.8; 330/149, 296, 51, 297

[56] References Cited

U.S. PATENT DOCUMENTS

| | | | |
|---|---|---|---|
| 3,828,267 | 8/1974 | Tsurushima | 330/295 |
| 3,992,677 | 11/1976 | Tsurushima | 330/149 |
| 4,135,590 | 1/1979 | Gaulder | 330/155 |
| 4,371,841 | 2/1983 | Eckert et al. | 330/51 |
| 4,433,306 | 2/1984 | Honda et al. | 330/297 |
| 4,441,040 | 4/1984 | Mundel et al. | 307/491 |
| 4,673,889 | 6/1987 | Cini et al. | 330/149 |
| 4,912,426 | 3/1990 | Hishiki | 330/253 |
| 5,151,942 | 9/1992 | Sasaki | 381/94.5 |
| 5,199,079 | 3/1993 | Anderson et al. | 381/94 |
| 5,220,613 | 6/1993 | Nishioka et al. | 381/104 |
| 5,300,892 | 4/1994 | Hirai | 330/149 |
| 5,420,535 | 5/1995 | Nebuloni et al. | 330/51 |
| 5,436,588 | 7/1995 | Ghaffaripour | 327/538 |
| 5,515,431 | 5/1996 | Kuhnle et al. | 379/388 |
| 5,537,081 | 7/1996 | Naokawa et al. | 330/270 |
| 5,825,251 | 10/1998 | Nakagawa | 330/297 |

FOREIGN PATENT DOCUMENTS 1360292  7/1974  United Kingdom.

*Primary Examiner*—Benny Lee
*Assistant Examiner*—K V Nguyen

[57] ABSTRACT

The present invention includes a method of lessening or suppressing a transient voltage comprising the step of biasing an output node for an output signal. The step of biasing includes a charge rate that is variable to lessen or suppress the transient, which can be audible. A node is biased to a voltage that corresponds to a voltage of an input signal. Preferably, the node is biased prior to providing the output signal. The present invention also includes a device for lessening a transient of an amplifier comprising a switch coupled to an output of the amplifier and a bias voltage source, wherein the switch is controllable to bias the output prior to the amplifier providing an amplified audio signal. The resistance of the switch can be variable to adjust the lessening of, or suppress, the transient. Instead of the switch, an impedance device can be used. The present invention contemplates lessening or suppressing the transient by either adjusting the charge rate or the bias voltage of the node. Alternatively, both the charge rate and bias voltage can be adjusted to lessen or suppress the transient.

8 Claims, 3 Drawing Sheets

6,040,740

AUDIO TRANSIENT SUPPRESSION DEVICE

FIELD OF THE INVENTION

The present invention relates to audio reproduction and more particularly to suppression of audible transients.

BACKGROUND OF THE INVENTION

Typically a fast transient occurs at the output of an audio amplifier when the output is enabled, e.g., upon power-up. Sometimes an audio transducer, such as a speaker or headphone, is coupled to the amplifier output during power-up or enablement. The fast transient is then audible as a "click" or "pop." Referring to FIG. 1A, an amplifier or driver 100, such as an op-amp, receives an audio signal via a lead 105. If amplifier 100 is used in a low voltage application, such as an integrated circuit, then the audio signal amplitude can vary in a range of between zero and five volts, inclusive. Such an audio signal usually has a common mode voltage between the limits of the voltage range. For example, the common mode voltage can be 2.5 volts.

When amplifier 100 is powered-up or its output is enabled while receiving the audio signal, a fast transient will occur on an output lead 110. Specifically, an enable or power-up signal is illustrated in FIG. 1B. The signal is inactive until a time T1, at which point amplifier 100 in FIG. 1A is powered-up or the output enabled. An output signal from amplifier 100 is provided on lead 110. This output signal, as shown in FIG. 1C, has a transient that occurs between times T2 and T3. Since lead 110 is coupled to an audio transducer, this transient output signal on lead 110 is audible as a pop or click. Portion 115 of the output signal shown in FIG. 1C represents the common mode voltage of the audio signal input to amplifier 100. Portion 115 can have an audio signal superimposed thereon.

To suppress this audible click or pop, many designs are utilized. One such design uses a feedback loop with the amplifier. Another design uses muting circuitry that essentially times turning the amplifier on and off. A further design controls the output stage of the amplifier. These implementations are complex and waste integrated circuit area.

A need exists for an implementation that eliminates the audible click or pop while being simple in design and using minimal integrated circuit area. The present invention meets this need.

SUMMARY OF THE INVENTION

The present invention includes a method of lessening or suppressing a transient voltage comprising the step of biasing an output node for an output signal. The step of biasing includes a charge rate that is variable to lessen or suppress the transient, which can be audible. Preferably, a node is biased to a voltage that corresponds to a voltage of an input signal. It is also preferred that the node is biased prior to providing the output signal.

The present invention also includes a device for lessening a transient of an amplifier comprising a switch coupled to an output of the amplifier and a bias voltage source, wherein the switch is controllable to bias the output prior to the amplifier providing an amplified audio signal. The resistance of the switch can be variable to adjust the lessening of, or suppress, the transient Instead of the switch, an impedance device can be used such as a resistor.

The present invention contemplates lessening or suppressing the transient by either adjusting the charge rate or the bias voltage of the node. Alternatively, both the charge rate and bias voltage can be adjusted to lessen or suppress the transient.

Numerous other advantages and features of the present invention will become readily apparent from the following detailed description of the invention and the embodiments thereof, from the claims and from the accompanying drawings in which details of the invention are fully and completely disclosed as a part of this specification.

DETAILED DESCRIPTION OF THE PREFERRED EMBODIMENT

Figure 1A:
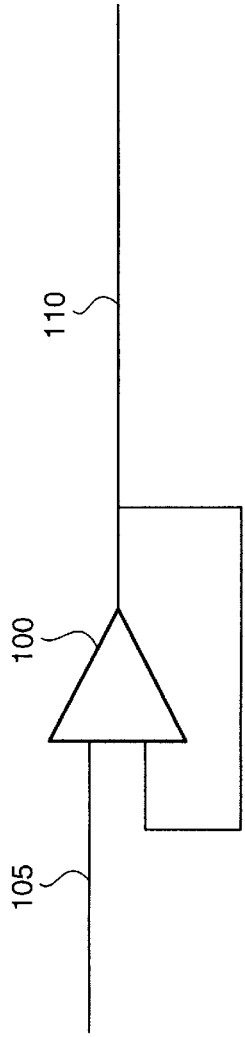
FIG. 1A is a schematic of an audio amplifier that produces transients.
Figure 1B:
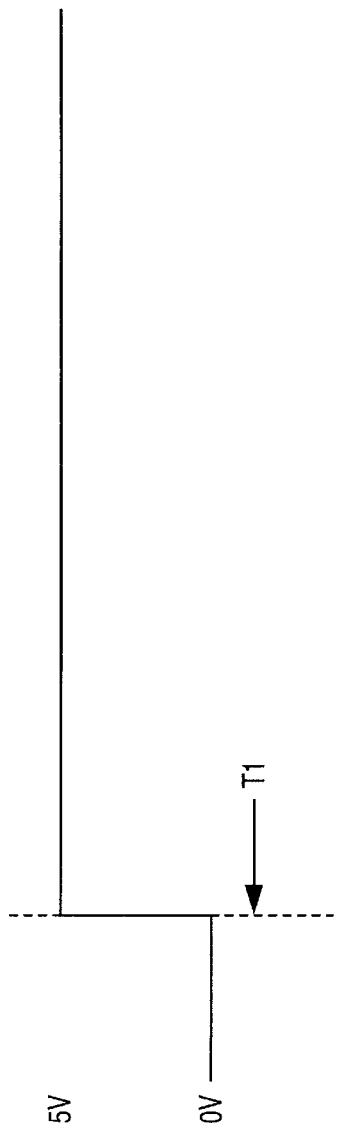
FIG. 1B illustrates an output enable or power-up signal for the FIG. 1A amplifier.
Figure 1C:
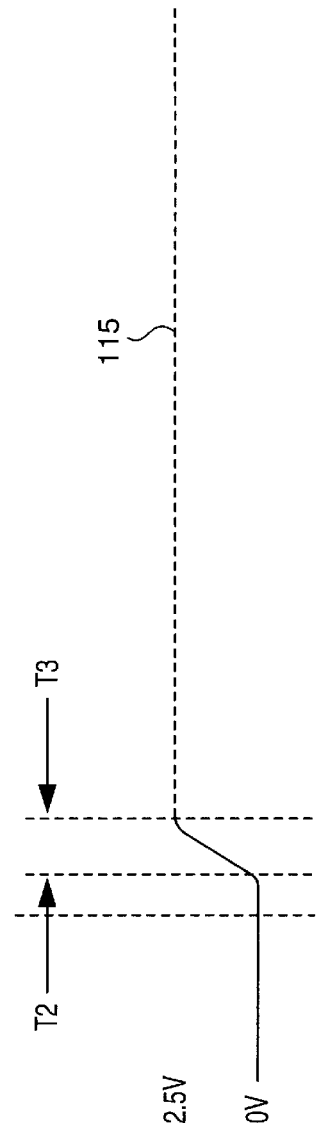
FIG. 1C is a timing diagram of a transient produced by the FIG. 1A audio amplifier when powered-up or its output enabled.

While this invention is susceptible of embodiment in many different forms, there is shown in the drawings and will be described herein in detail a specific embodiment thereof with the understanding that the present disclosure is to be considered as an exemplification of the principles of the invention and is not to be limited to the specific embodiment described.

Figure 2:
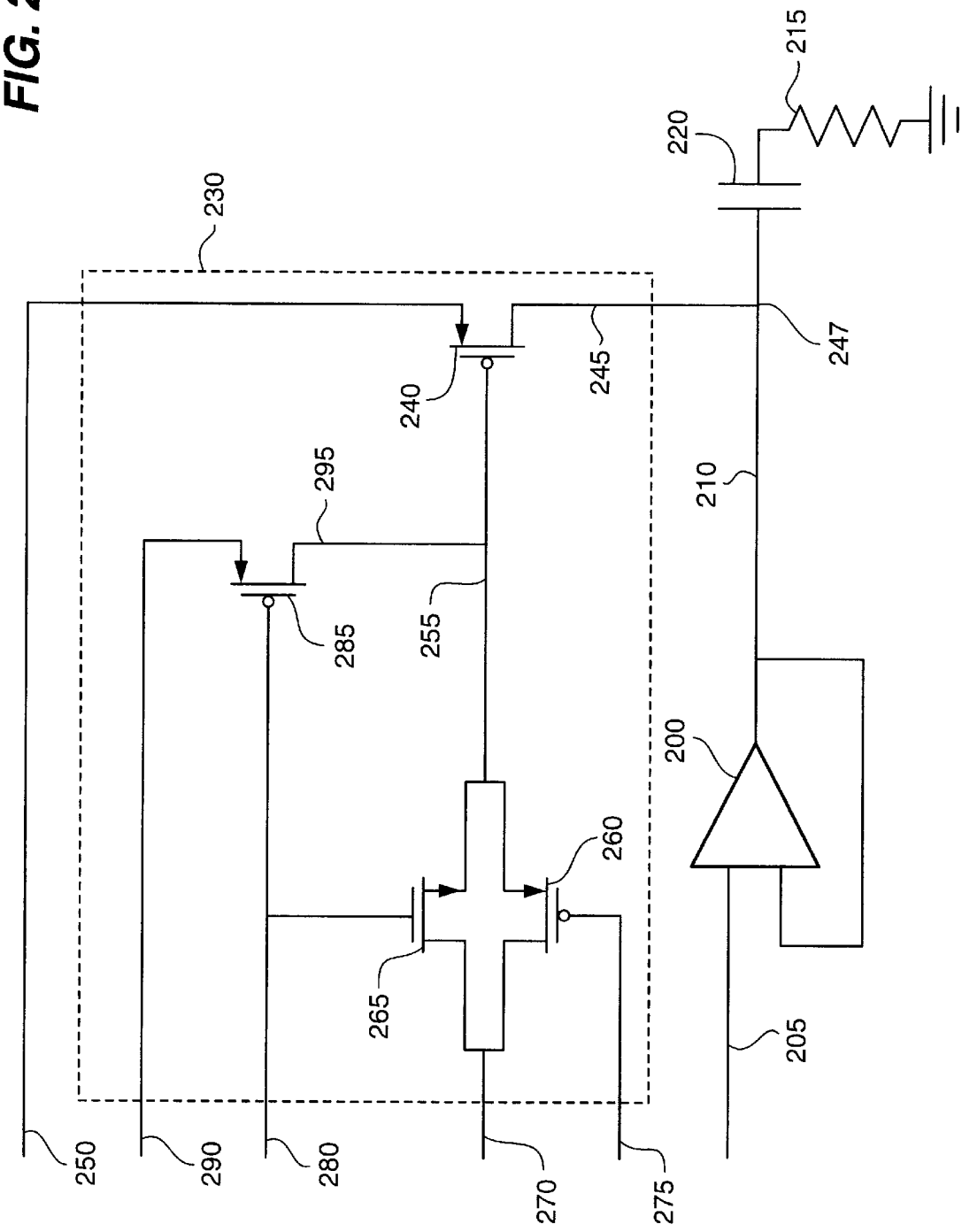
FIG. 2 is a schematic of an audio amplifier coupled to a transient suppression device according to the present invention.

FIG. 2 illustrates a schematic that includes a preferred embodiment of the present invention. An amplifier 200 receives an audio signal via a lead 205. Amplifier 200 is configured as a voltage follower. When powered-up or its output enabled, an output signal, preferably an amplified audio signal, is provided on lead 210. A speaker or headphone, represented by resistor 215, is AC coupled to lead 210 via a capacitor 220 to receive the output signal.

A transient suppression device or circuit according to the present invention is referenced by numeral 230. Transient suppression circuit 230 includes a p-type transistor 240 that is coupled to lead 210 at an output node 247 via a lead 245 and is coupled to receive a bias voltage $V_{bias}$ via a lead 250. A gate of transistor 240 is connected to a lead 255 to a p-type transistor 260 and a n-type transistor 265 configured as a pass gate. Transistors 260, 265 are coupled to receive a bias enable signal via a lead 270. The bias enable signal is preferably active low.

Leads 280 and 275 respectively provide a power-on signal and its complement to the pass gate. The power-on signal is preferably active low. Lead 280 also provides the power-on signal to a gate of a transistor 285. Transistor 285 is coupled to a power supply via a lead 290 to receive a power supply voltage, such as five volts. Transistor 285 is also coupled to lead 255 via a lead 295.

The operation of the FIG. 2 circuit will described with reference to FIGS. 3A–3C. Briefly, when the power-on signal is active low, transistor 240 is maintained off so that node 247 is not biased to bias voltage $V_{bias}$. When the power-on signal is inactive high and the bias enable signal is active low, transistor 240 is turned on so node 247 is biased to the bias voltage $V_{bias}$. In this manner, an audible transient is at least lessened, but is preferably suppressed.

In more detail, at a time Tl the power-on signal is inactive high and the bias enable signal is active low. The inactive power-on signal turns off transistor 285 to uncouple lead 255 from the power supply via lead 290. The inactive power-on signal also turns on the pass gate so that the active bias enable signal is provided to the gate of transistor 240 to turn transistor 240 on. On transistor 240 provides the bias voltage $V_{bias}$ to node 247.

At a time T2, a voltage at node 247 starts to increase until it is approximately equal to the bias voltage $V_{bias}$, indicated at a time T3. Subsequently, at a time T4, the power-on signal is active low and the bias enable signal is inactive high. At time T4, an output signal is provided by amplifier 200 on lead 210 to node 247. This is indicated as portion 300 in FIG. 3C. The voltage of portion 300 can be approximately the same as the bias voltage at node 247, or it can have an audio signal superimposed thereon.

One skilled in the art can readily recognize that varying the charge rate at node 247 can lessen or suppress the audible transient. Varying the charge rate can be accomplished by providing a resistance in the bias voltage power supply to node 247 path to achieve the desired lessening or suppression. In the preferred embodiment, transistor 240 has a resistance of approximately 10 Kohms. Again, by varying the resistance in the path will produce a corresponding variance in the charge rate of node 247. Such charge rate will dictate the amount of lessening of the transient or total suppression of the transient.

Lessening of the transient occurs by biasing node 247 to a voltage not equal to the voltage associated with the input signal to amplifier 200, such as the common mode voltage. When the transient occurs, the change in voltage is less than the change in voltage if the node was not biased. Alternatively, lessening occurs when the node is biased at such a charge rate that the transient is audible, but not as severe as if the transient occurred without the node biased. If desired, a combination of these two alternatives may be used to lessen the transient.

Numerous variations and modifications of the embodiment described above may be effected without departing from the spirit and scope of the novel features of the invention. For example, the present invention is not limited to the type of transistors illustrated in the figures. Also, transistors 260, 265 and 285 can be replaced with any device or circuit that performs the function of turning transistor 240 on and off in the manner described herein.

Figure 3A:
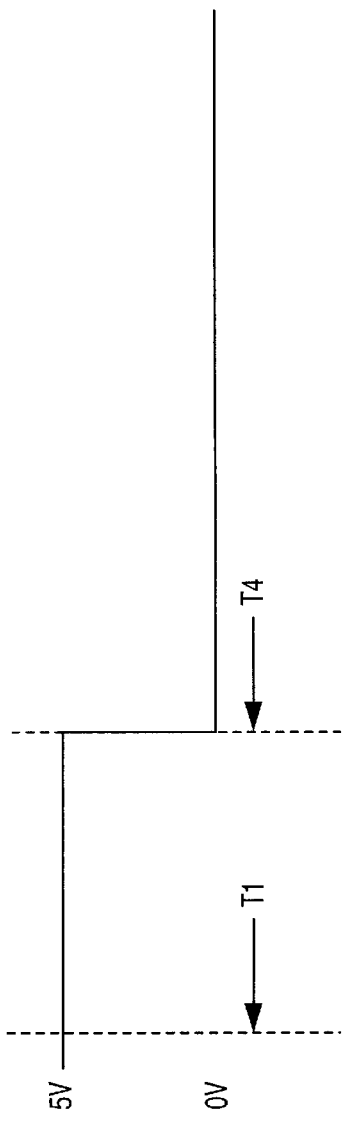
FIGS. 3A–3C are a timing diagram of the operation of the FIG. 2 schematic.
Figure 3B:
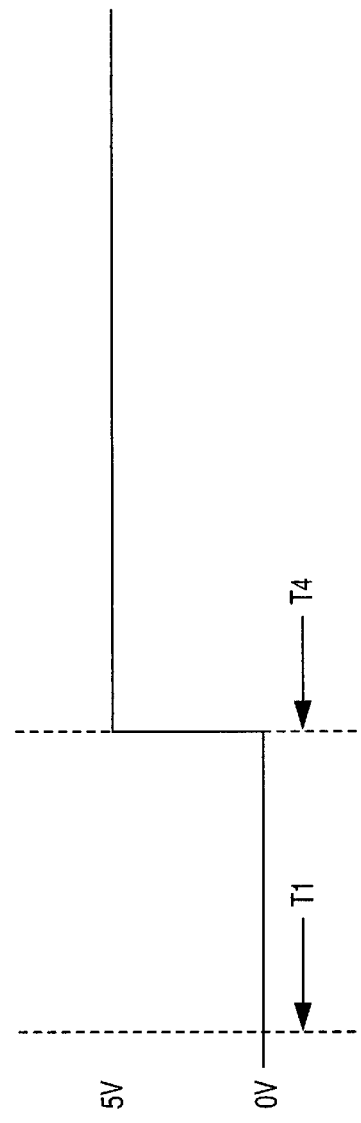
Figure 3C:
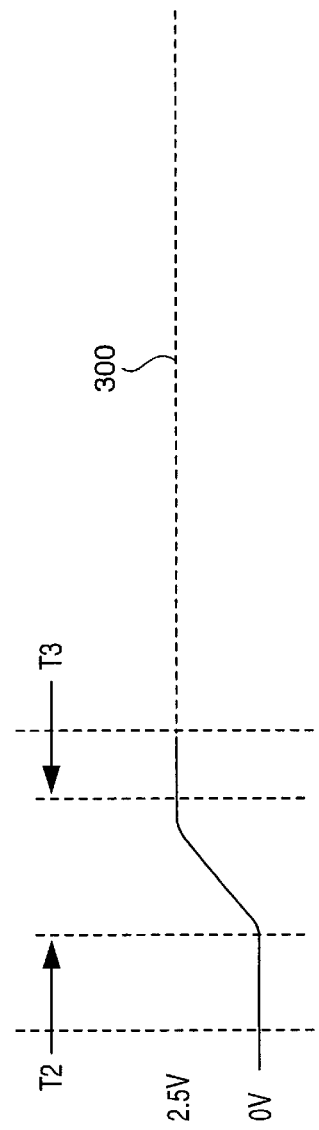

Further variations may occur in the timing illustrated in FIGS. 3A–3C. It is preferred that the timing is such that the amplifier output signal is not driving node 247 while transistor 240 is electrically receiving the bias voltage $V_{bias}$. Node 247 can also be biased to a voltage that is different from the common mode voltage to lessen the transient. In addition, node 247 can be biased by charging it to a voltage corresponding to a common mode voltage of an input signal. It follows that the charge rate and bias voltage may be varied together or individually to obtain the desired lessening or suppression of the transient.

Transistor 240 of the present invention can be replaced with a preferably high impedance device. In this case, the amplifier should be able to out-drive the bias voltage being provided to node 247.

It is to be understood that no limitations with respect to the specific device illustrated herein are intended or should be inferred. It is, of course, intended to cover by the appended claims all such modifications.

I claim:

1. A method of suppressing an audible transient generated from an amplifier comprising the step of biasing an output node coupled to the amplifier to approximately a voltage corresponding to a common mode voltage of an audio signal input to the amplifier.

2. The method of claim 1 wherein the step of biasing occurs before an output signal is provided by the amplifier.

3. The method of claim 1 wherein the step of biasing includes a variable output node charge rate.

4. The method of claim 1 wherein the node rate is variable by changing a resistance.

5. A device for suppressing an audible transient generated from an amplifier, said device configured to bias an output node coupled to the amplifier to approximately a voltage corresponding to a common mode voltage of an audio signal input to the amplifier.

6. The device of claim 5 wherein device is configured to bias the output node before an output signal is provided by the amplifier.

7. The device of claim 5 wherein the device is configured to vary a charge rate of the output node.

8. The device of claim 7 wherein the device is configured to vary the charge rate of the output node by changing a resistance of the output node.

* * * * *